(12) United States Patent
Kwon

(10) Patent No.: US 10,796,616 B2
(45) Date of Patent: Oct. 6, 2020

(54) INSPECTION SYSTEM, METHOD OF MULTI-TIME PROGRAMMING IN THE SAME AND DISPLAY DEVICE

(71) Applicant: Samsung Display Co., Ltd., Yongin-si, Gyeonggi-do (KR)

(72) Inventor: Myoung-Ho Kwon, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/405,546

(22) Filed: May 7, 2019

(65) Prior Publication Data

US 2020/0051473 A1 Feb. 13, 2020

(30) Foreign Application Priority Data

Aug. 8, 2018 (KR) ........................ 10-2018-0092415

(51) Int. Cl.
*G09G 3/00* (2006.01)
*G11C 16/10* (2006.01)
*G09G 3/20* (2006.01)

(52) U.S. Cl.
CPC ........... *G09G 3/006* (2013.01); *G09G 3/2092* (2013.01); *G11C 16/10* (2013.01); *G09G 2310/08* (2013.01); *G09G 2320/043* (2013.01); *G09G 2330/04* (2013.01)

(58) Field of Classification Search
CPC .. G09G 3/006; G09G 3/2092; G09G 2310/08; G09G 2320/043; G09G 2330/04; G11C 16/10

USPC ..................................................... 365/185.18
See application file for complete search history.

(56) References Cited

U.S. PATENT DOCUMENTS

| | | | | |
|---|---|---|---|---|
| 2007/0035533 A1* | 2/2007 | Kim | ................... | G09G 5/006 345/204 |
| 2011/0025665 A1* | 2/2011 | Bae | ................... | G09G 3/3208 345/211 |
| 2016/0117583 A1* | 4/2016 | Butler | ................... | G07C 5/008 340/10.51 |
| 2016/0155376 A1 | 6/2016 | Shin et al. | | |
| 2018/0321734 A1* | 11/2018 | Wu | ................... | H02M 3/3376 |

FOREIGN PATENT DOCUMENTS

| | | |
|---|---|---|
| KR | 10-1056433 B1 | 8/2011 |
| KR | 10-1157949 B1 | 6/2012 |

* cited by examiner

*Primary Examiner* — Fernando Hidalgo
(74) *Attorney, Agent, or Firm* — Lewis Roca Rothgerber Christie LLP

(57) ABSTRACT

An inspection system includes a display device including a nonvolatile memory, an inspection device configured to generate a writing voltage for application to the nonvolatile memory, and a protection part configured to apply the writing voltage to the nonvolatile memory when the writing voltage is within an allowable voltage range, and not to apply the writing voltage to the nonvolatile memory when the writing voltage is not within the allowable voltage range. The application of the writing voltage to the nonvolatile memory enables a multi-time programming (MTP) operation in which reference data writes to the nonvolatile memory.

20 Claims, 8 Drawing Sheets

MAINTAINING INITIAL STATUS

NOT MAINTAINING INITIAL STATUS
(ABNORMAL MTP STATUS)

NOT MAINTAINING INITIAL STATUS
(ABNORMAL MTP STATUS)

INSPECTION SYSTEM, METHOD OF MULTI-TIME PROGRAMMING IN THE SAME AND DISPLAY DEVICE

This application claims priority to and the benefit of Korean Patent Application No. 10-2018-0092415 filed on Aug. 8, 2018, which is hereby incorporated by reference for all purposes as if fully set forth herein.

BACKGROUND

1. Field

The present disclosure relates to an inspection system and a display device for improving drive reliability, and a method of multi-time programming using the inspection system and a display device.

2. Description of the Related Art

Display devices include a liquid crystal display (LCD) and an organic light emitting display (OLED).

The LCD device includes a liquid crystal display panel displaying an image using light transmittance of a liquid crystal and a backlight assembly disposed under the liquid crystal display panel and providing light to the liquid crystal display panel.

The OLED device displays an image using an organic light emitting diode that emits light by recombination of electrons and holes. OLED devices are most often used because it has a fast response time and is driven with low power consumption.

The display device performs various characteristic tests required for driving the display device during production processes, and writes reference data for driving, which is obtained in various characteristics tests, in a nonvolatile memory. The operation of writing reference data to nonvolatile memory is called a Multi-time Programming (MTP). The reference data may include data such as correction values of image data according to electric and optical characteristics, individual driving voltages of each driving unit of the display device, panel driving voltages and driving timing.

During the production processes, when the reference data is written to the nonvolatile memory through an inspection device, an abnormal voltage may be applied due to an intermittent operation error of the inspection device and an external EDS, so that abnormal reference data may be written. After the abnormal reference data are written to the nonvolatile memory, the abnormal reference data may not be erased, which may degrade the reliability of the display device.

SUMMARY

Exemplary embodiments of the present disclosure provide an inspection system for improving drive reliability.

Exemplary embodiments of the present disclosure provide a method of multi-time programming reference data to a display device.

According to an exemplary embodiment of the present disclosure, an inspection system includes a display device including a nonvolatile memory, an inspection device configured to generate a writing voltage for application to the nonvolatile memory, and a protection part configured to apply the writing voltage to the nonvolatile memory when the writing voltage is within an allowable voltage range, and not to apply the writing voltage to the nonvolatile memory when the writing voltage is not within the allowable voltage range. The application of the writing voltage to the nonvolatile memory enables a multi-time programming (MTP) operation in which reference data writes to the nonvolatile memory.

In an exemplary embodiment, the inspection device may include an inspection controller configured to generate the writing voltage, and the protection part may be connected between the inspection controller and the nonvolatile memory.

In an exemplary embodiment, the protection part may be in the display device.

In an exemplary embodiment, the protection part may be in the inspection device.

In an exemplary embodiment, the protection part may include a first comparator configured to compare a first reference voltage and the writing voltage, a second comparator configured to compare a second reference voltage and the writing voltage, and a logic circuit configured to generate a write control signal for controlling whether to apply the writing voltage to the nonvolatile memory based on output signals of the first and second comparators.

In an exemplary embodiment, the first reference voltage may be a low voltage lower than the writing voltage, the second reference voltage may be a high voltage higher than the writing voltage, and the logic circuit may be an NOR logical operator.

In an exemplary embodiment, the first reference voltage may be a high voltage higher than the writing voltage, the second reference voltage may be a low voltage lower than the writing voltage, and the logic circuit may be an AND logical operator.

In an exemplary embodiment, the nonvolatile memory may include an MTP cell unit including a series of one-time programming (OTP) cells, and a voltage controller configured to control whether to apply the writing voltage to the MTP cell unit in response to the write control signal.

In an exemplary embodiment, the OTP cell may be configured to initially maintain a '0' status and change from the '0' status to a '1' status when the write voltage is applied.

In an exemplary embodiment, the voltage controller may include a transistor which includes a control electrode configured to receive the write control signal, a first electrode configured to receive the writing voltage, and a second electrode connected to the MTP cell unit.

According to an exemplary embodiment of the present disclosure, a method of multi-time programming reference data to a nonvolatile memory in a display device includes generating a writing voltage for writing to the nonvolatile memory, applying the writing voltage to the nonvolatile memory when the writing voltage is within an allowable voltage range, and not applying the writing voltage to the nonvolatile memory when the writing voltage is not within the allowable voltage range In an exemplary embodiment, the method may further include comparing a first reference voltage and the writing voltage, comparing a second reference voltage and the writing voltage, and generating a write control signal for controlling whether to apply the writing voltage to the nonvolatile memory the based on the comparisons of the writing voltage with the first and second reference voltages.

In an exemplary embodiment, the first reference voltage may be a low voltage lower than the writing voltage, the second reference voltage may be a high voltage higher than the writing voltage, and the write control signal may be generated by using an NOR logical operator.

In an exemplary embodiment, the first reference voltage may be a high voltage higher than the writing voltage, the second reference voltage may be a low voltage lower than the writing voltage, and the write control signal may be generated by using an AND logical operator.

In an exemplary embodiment, the method may further include controlling whether to apply the writing voltage to an MTP cell unit in response to the write control signal, wherein the nonvolatile memory includes the MTP cell unit including a series of one-time programming (OTP) cells.

In an exemplary embodiment, the OTP cell may initially maintain a '0' status and change from the '0' status to a '1' status when the write voltage is applied.

According to an exemplary embodiment of the present disclosure, a display device includes a display part including a series of pixels, a nonvolatile memory, and a protection part configured to receive a writing voltage for application to the nonvolatile memory. The protection part is configured to apply the writing voltage to the nonvolatile memory when the writing voltage is within an allowable voltage range, and not to apply the writing voltage to the nonvolatile memory when the writing voltage is not within the allowable voltage range. The application of the writing voltage to the nonvolatile memory enables a multi-time programming (MTP) in which a reference data writes to the nonvolatile memory.

In an exemplary embodiment, the protection part may include a first comparator configured to compare a first reference voltage and the writing voltage, a second comparator configured to compare a second reference voltage and the writing voltage, and a logic circuit configured to generate a write control signal for controlling whether to apply the writing voltage to the nonvolatile memory the based on output signals of the first and second comparators.

In an exemplary embodiment, the nonvolatile memory may include an MTP cell unit including a series of one-time programming (OTP) cells and a voltage controller configured to control whether to apply the writing voltage to the MTP cell unit in response to the write control signal.

In an exemplary embodiment, the display device may further include a driving voltage generator configured to generate the first reference voltage and the second reference voltage.

According to aspects of embodiments of the present disclosure, the inspection system checks whether the MTP voltage is the abnormal MTP voltage in the multi-time programming mode. When the MTP voltage is the abnormal MTP voltage, the abnormal MTP voltage may be blocked from being applied to the nonvolatile memory. Thus, the abnormal data may be prevented from being written into the nonvolatile memory.

BRIEF DESCRIPTION OF THE DRAWINGS

The above and other features and advantages of the inventive concept will become more apparent by describing in detailed exemplary embodiments thereof with reference to the accompanying drawings, in which.

DETAILED DESCRIPTION

Hereinafter, the present disclosure will be explained in detail with reference to the accompanying drawings.

Figure 1:
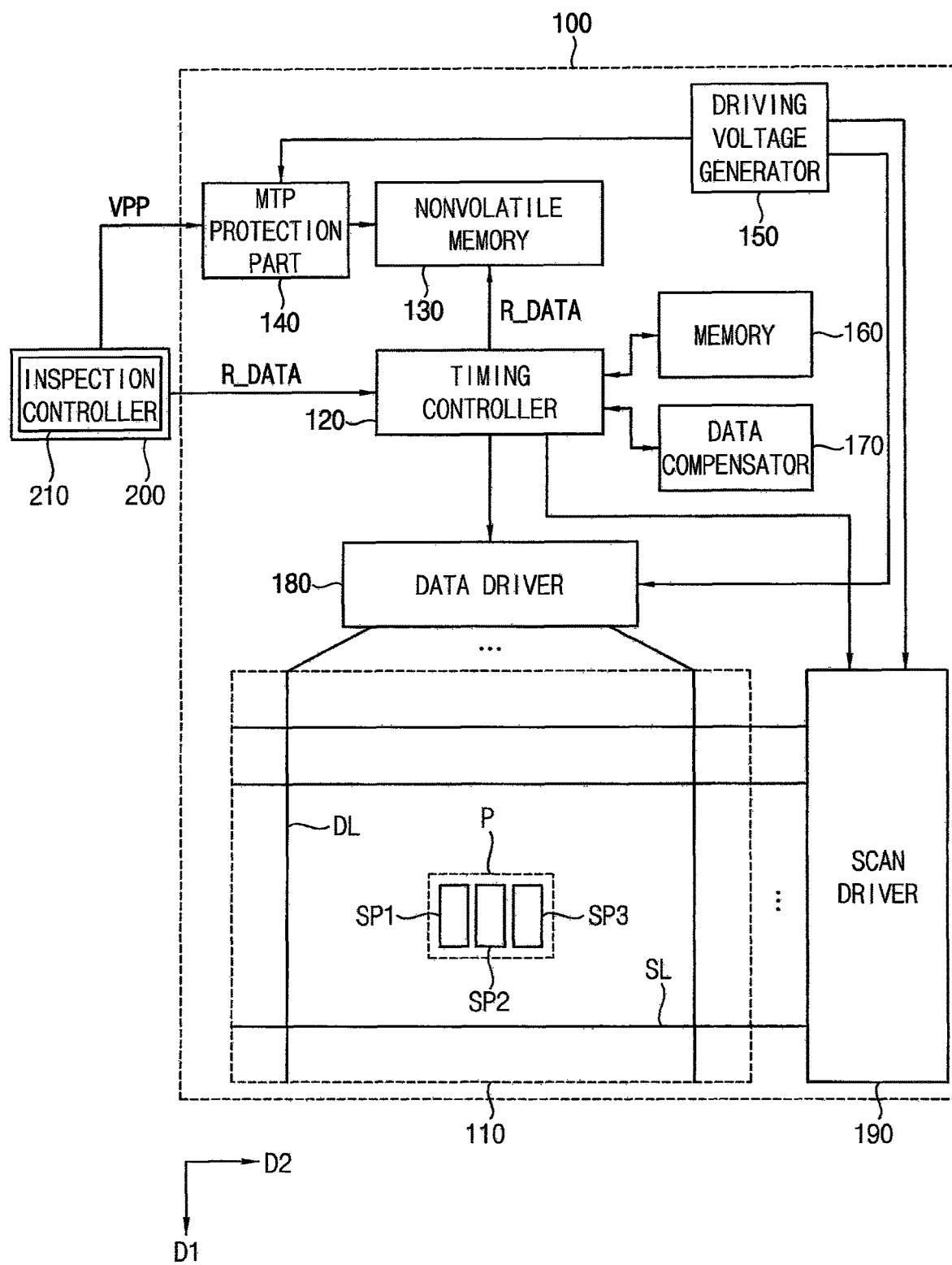
FIG. 1 is a block diagram illustrating an inspection system according to one exemplary embodiment.

FIG. 1 is a block diagram illustrating an inspection system according to one exemplary embodiment;

Referring to FIG. 1, the inspection system may include a display device 100 and an inspection device 200.

The inspection device 200 may include an inspection controller 210. The inspection controller 210 is configured to generate various testing signals used in various inspection modes and generally control inspection operations of the inspection device 200.

In an exemplary embodiment, the inspection controller 210 may generate and/or transfer a writing voltage that is an MTP (multi-time programming) voltage VPP to be applied to the nonvolatile memory 130 and generate and/or transfer various reference data R_DATA to the display device 100 to be written to the nonvolatile memory 130 of the display device 100 in a multi-time programming mode. The multi-time programming mode may be performed in a sleep-in mode in which the display device 100 does not display an image.

The display device 100 may include a display part 110, a timing controller 120, a nonvolatile memory 130, an MTP protection part 140, a driving voltage generator 150, a memory 160, a data compensator 170, a data driver 180, and a scan driver 190.

The display part 110 may include a plurality of data lines DL and a plurality of scan lines SL and a plurality of sub pixels SP1, SP2 and SP3.

The plurality of data lines DL is arranged spaced apart from each other in a first direction D1, and each data line DL extends in a second direction D2 crossing the first direction D1.

The plurality of scan lines SL is arranged spaced apart from each other in the second direction D2, and each scan line SL extends in the first direction D1.

The plurality of sub pixels SP is arranged as a matrix which includes a plurality of pixel columns and a plurality of pixel rows. Each of the sub pixels SP may include a display element, at least one transistor and at least one capacitor for driving the display element. The display element may include an organic light emitting diode and a liquid crystal capacitor.

The timing controller 120 may generally control operations of the display device 100.

In an exemplary embodiment, the timing controller 120 is configured to receive reference data R_DATA from the inspection device 200 so that the received reference data R_DATA is written to the nonvolatile memory 130 in the multi-time programming mode.

In the multi-time programming mode, the reference data R_DATA is written to the nonvolatile memory 130 using the MTP voltage VPP. The nonvolatile memory 130 may include a flash memory, an EEPROM, etc.

The MTP voltage VPP is a control voltage for controlling a status of a plurality of OTP cells in the nonvolatile memory 130. For example, the OTP cell initially maintains a '0' status and changes from the '0' status to a '1' status when the write voltage is applied. The OTP cell may write '0' or '1' of 1-bit data.

Registers in the non-volatile memory 130 are allocated for each type of reference data, and a plurality of parameters corresponding to the plurality of levels of reference data may be written in each register.

For example, referring to the non-volatile memory 130, the reference data of the plurality of high level voltages corresponding to the scan high voltage applied to the scan driver may be written in the plurality of parameters of the first register, and the reference data of the plurality of low level voltages corresponding to the scan low voltage applied to the scan driver may be written in the plurality of parameters of the second register.

The MTP protection part 140 is configured to receive the MTP voltage VPP from the inspection device 200 in the multi-time programming mode. The MTP protection part 140 is configured to check the MTP voltage VPP based on an allowable voltage range. The MTP protection part 140 may block the MTP voltage VPP from being applied to the nonvolatile memory 130 when the MTP voltage VPP is not within the allowable voltage range.

The driving voltage generator 150 is configured to generate a plurality of driving voltages.

According to an exemplary embodiment, the driving voltage may include a plurality of reference voltages for determining the allowable voltage range for checking whether the MTP voltage is abnormal.

In the multi-time programming mode, the plurality of reference voltages generated from the driving voltage generator 150 are provided to the MTP protection part 140.

The memory 160 may store the reference data provided from the nonvolatile memory 130 during a period during which the display device displays a normal image in a display mode. The reference data stored in the memory 160 may be used as the reference data for driving the display device. The memory 160 may include a RAM.

The data compensator 170 is configured to generate compensation image data using the reference data for compensation of image data stored in the memory 160 according to the control of the timing controller 120 in the display mode.

The data driver 180 is configured to generate a data voltage corresponding to the image data according to the control of the timing controller 120 based on the reference data stored in the memory 160 and provide the data voltage to the plurality of data lines DL.

The scan driver 190 is configured to generate scan signals according to the control of the timing controller 120 based on the reference data stored in the memory 160, and sequentially provide the scan signals to the plurality of scan lines SL.

Figure 2:
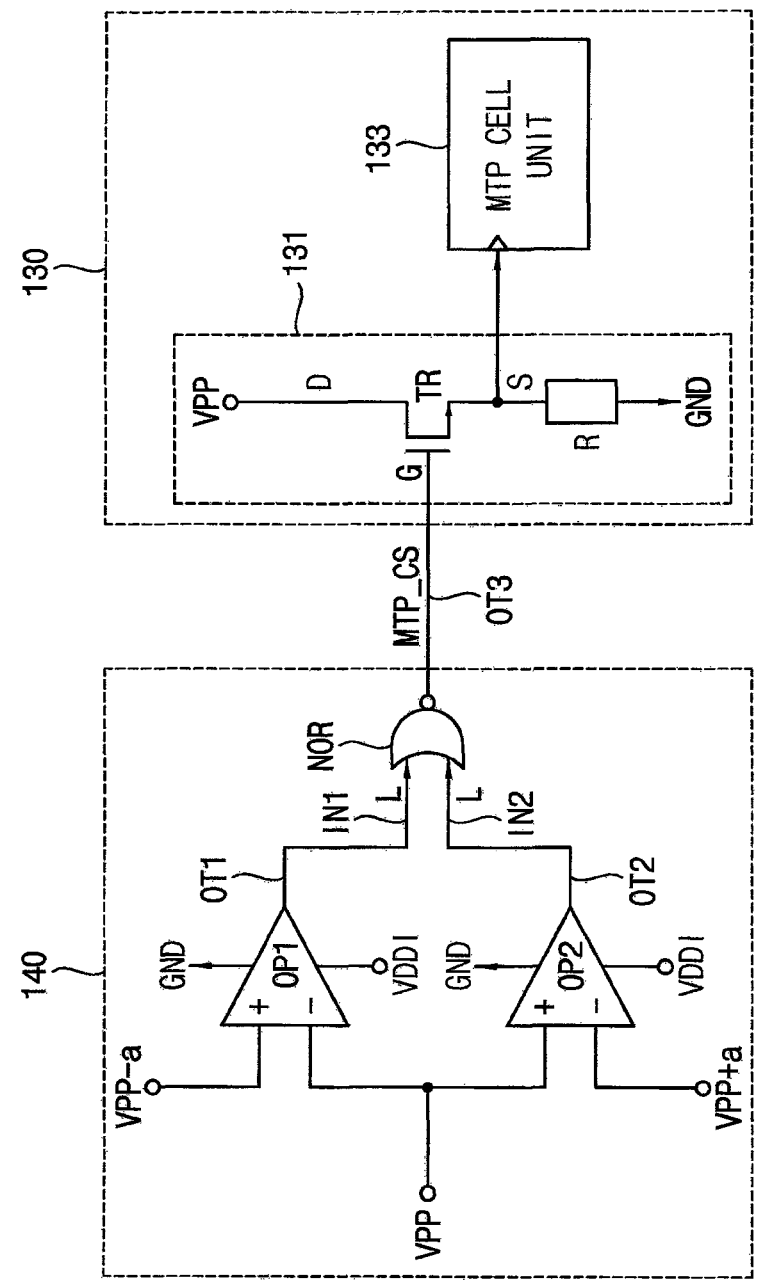
FIG. 2 is a circuit diagram illustrating a multi-time programming (MTP) protection part according to one exemplary embodiment.
Figure 3:
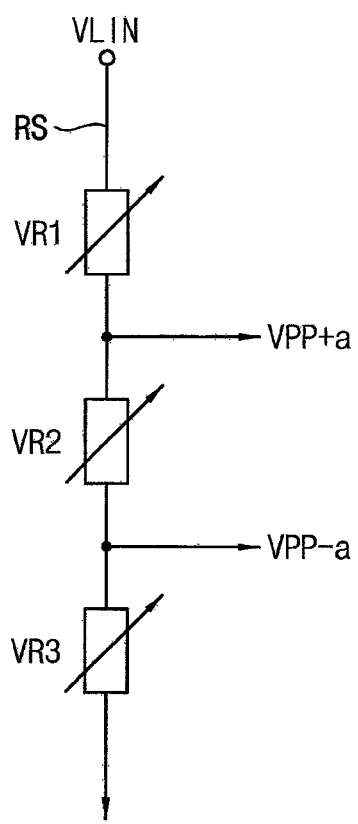
FIG. 3 is a circuit diagram illustrating a driving voltage generator according to one exemplary embodiment.

FIG. 2 is a circuit diagram illustrating a multi-time programming (MTP) protection part according to one exemplary embodiment. FIG. 3 is a circuit diagram illustrating a driving voltage generator according to one exemplary embodiment.

Referring to FIGS. 1 and 2, the MTP protection part 140 is configured to apply the MTP voltage VPP to the nonvolatile memory 130 when the MTP voltage VPP is within the allowable voltage range. The MTP protection part 140 is configured to block the MTP voltage VPP from being applied to the nonvolatile memory 130, when the MTP voltage VPP is not within the allowable voltage range.

The MTP protection part 140 may include a first comparator OP1, a second comparator OP2 and a logic circuit NOR.

The first comparator OP1 may include a first input terminal (+) receiving a first reference voltage VPP-a that is a low voltage lower than the MTP voltage VPP, a second input terminal (−) receiving the MTP voltage VPP and an output terminal OT1. The first comparator OP1 may receive a first power source voltage VDDI and a second power source voltage GND.

The first comparator OP1 is configured to output a low signal L when the MTP voltage VPP is higher than the first reference voltage VPP-a, and output a high signal H when the MTP voltage VPP is lower than the first reference voltage VPP-a.

The second comparator OP2 may include a first input terminal (+) receiving the MTP voltage VPP, a second input terminal (−) receiving a second reference voltage VPP+a that is a high voltage higher than the MTP voltage VPP and an output terminal OT2. The second comparator OP2 may receive the first power source voltage VDDI and the second power source voltage GND.

The second comparator OP2 is configured to output a low signal L when the MTP voltage VPP is lower than the second reference voltage VPP+a, and output a high signal H when the MTP voltage VPP is higher than the second reference voltage VPP+a.

Referring to FIG. 3, according to the exemplary embodiment, the first reference voltage VPP-a and the second reference voltage VPP+a may be generated by using a variable resistor string RS. The variable resistor string RS may include a plurality of variable resistors VR1, VR2 and VR3. The variable resistor string RS may divide a driving voltage VLIN provided from the driving voltage generator 150 into a first reference voltage VPP-a and a second reference voltage VPP+a using the variable resistors VR1, VR2 and VR3 and outputs the divided voltage.

Referring again now to FIG. 2, the logic circuit NOR is configured to generate a write control signal MTP_CS based on the output signals of the first and second comparators OP1 and OP2 and output the write control signal MTP_CS to the nonvolatile memory 130.

The logic circuit NOR may be an NOR gate of a logical operator.

The logic circuit NOR may include a first input terminal IN1 connected to the output terminal OT1 of the first comparator OP2, a second input terminal IN2 connected to the output terminal OT2 of the second comparator OP2 and an output terminal OT3 connected to the nonvolatile memory 130.

The logic circuit NOR is configured to output the write control signal MTP_CS of a high signal H when a low signal L is received from the first comparator OP1 and a low signal L is received from the second comparator OP2.

The logic circuit NOR is configured to output the write control signal MTP_CS of a low signal L when a high signal H is received from at least one of the first comparator OP1 and the second comparator OP2.

The nonvolatile memory 130 may include a voltage controller 131 and an MTP unit 133.

The voltage controller 131 may include a control transistor TR.

The control transistor TR may include a control electrode connected to the output terminal OT3 of the logic circuit NOR, a first electrode receiving the MTP voltage VPP and a second electrode connected to a voltage terminal of the MTP unit 133.

When an output signal of the logic circuit NOR is the high signal H, the control transistor TR is turned on and the MTP voltage VPP is outputted through the voltage terminal of the MTP unit 133. Thus, when the MTP voltage VPP is applied to the MTP unit 133, a multi-time programming process is performed.

However, when the at least one of the first and second comparators OP1 and OP2 outputs the high signal H, the logic circuit NOR outputs the write control signal MTP_CS of the low signal L. When the MTP voltage VPP is lower than the first reference voltage VPP-a or higher than the second reference voltage VPP+a, the logic circuit NOR outputs the write control signal MTP_CS of the low signal L.

When the output signal of the logic circuit NOR is the low signal L, the control transistor TR is turned off and the MTP voltage VPP is not applied to the MTP voltage terminal of the nonvolatile memory 130.

According to an exemplary embodiment, when the MTP voltage VPP is between the first reference voltage VPP-a and the second reference voltage VPP+a, the MTP voltage VPP is applied to the MTP voltage terminal of the nonvolatile memory 130. When the MTP voltage VPP is equal to or less than the first reference voltage VPP-a or equal to or more than the second reference voltage VPP+a, the MTP voltage VPP may be blocked from being applied to the MTP voltage terminal of the MTP unit 133 in the nonvolatile memory 130.

Therefore, the abnormal data may be prevented from being written in the nonvolatile memory 130.

The MTP unit 133 may include a plurality of OTP cells corresponding to bits of reference data stored in the nonvolatile memory 130. Each of the OTP cells may write 1-bit data. When the MTP voltage VPP is applied to the MTP unit 133, the multi-time programming process is performed. When the MTP voltage VPP is blocked, the multi-time programming process is not performed.

Figure 4A:
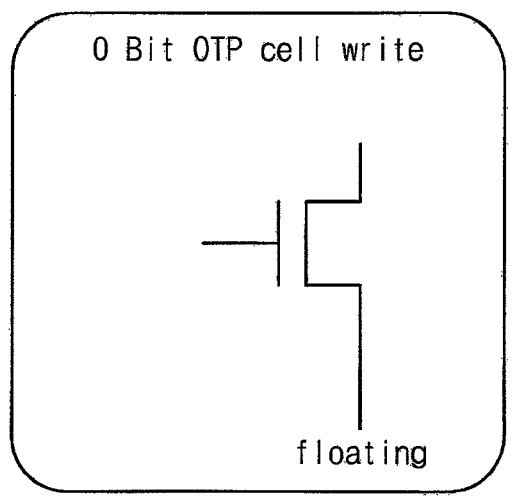
FIGS. 4A and 4B are conceptual diagrams illustrating an operation of a one-time programming (OTP) cell according to one exemplary embodiment.
Figure 4B:
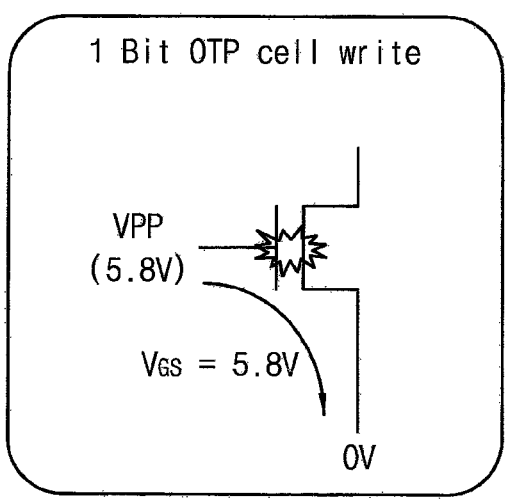

FIGS. 4A and 4B are conceptual diagrams illustrating an operation of a one-time programming (OTP) cell according to one exemplary embodiment.

The nonvolatile memory may include a plurality of OTP cells corresponding to a storage capacity of the reference data.

Referring to FIG. 4A, the OTP cell maintains '0' at an initial status. When the writing value corresponding to the OTP cell is '0', the initial status '0' is maintained.

However, referring to FIG. 4B, when the writing value corresponding to the OTP cell is '1', the MTP voltage VPP is applied to the OTP cell, a bias voltage VGS is applied to the OTP cell, an oxide layer of the OTP cell is destroyed and the OTP cell is changed from the '0' state to the '1' state OTP cell. The OTP cell may write '0' or '1' of 1-bit data.

Figure 5:
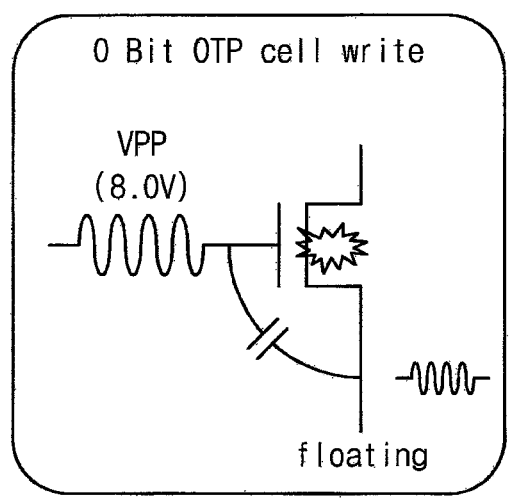
FIG. 5 is a conceptual diagram illustrating a abnormal operation of an OTP cell according to a comparative exemplary embodiment.

FIG. 5 is a conceptual diagram illustrating a abnormal operation of an OTP cell according to a comparative exemplary embodiment.

Referring to FIG. 5, the writing value written in the OTP cell is '0' and then the initial status is maintained. At this time, an abnormal voltage is applied to the OTP cell due to the operation error of the inspection device and the ESD input, and the OTP cell is changed from the 0 'state to the' 1 'state. Thus, the OTP cell writes abnormal bit data. The abnormal data written in the OTP cell may not be deleted.

When the abnormal data are written to the nonvolatile memory, the reliability of the display device may be degraded due to an error in the reference data.

In order to solve such a problem, after checking whether the MTP voltage provided by the inspection device is abnormal, the multi-time programming process may be controlled in the multi-time programming mode that writes the reference data to the nonvolatile memory.

Figure 6:
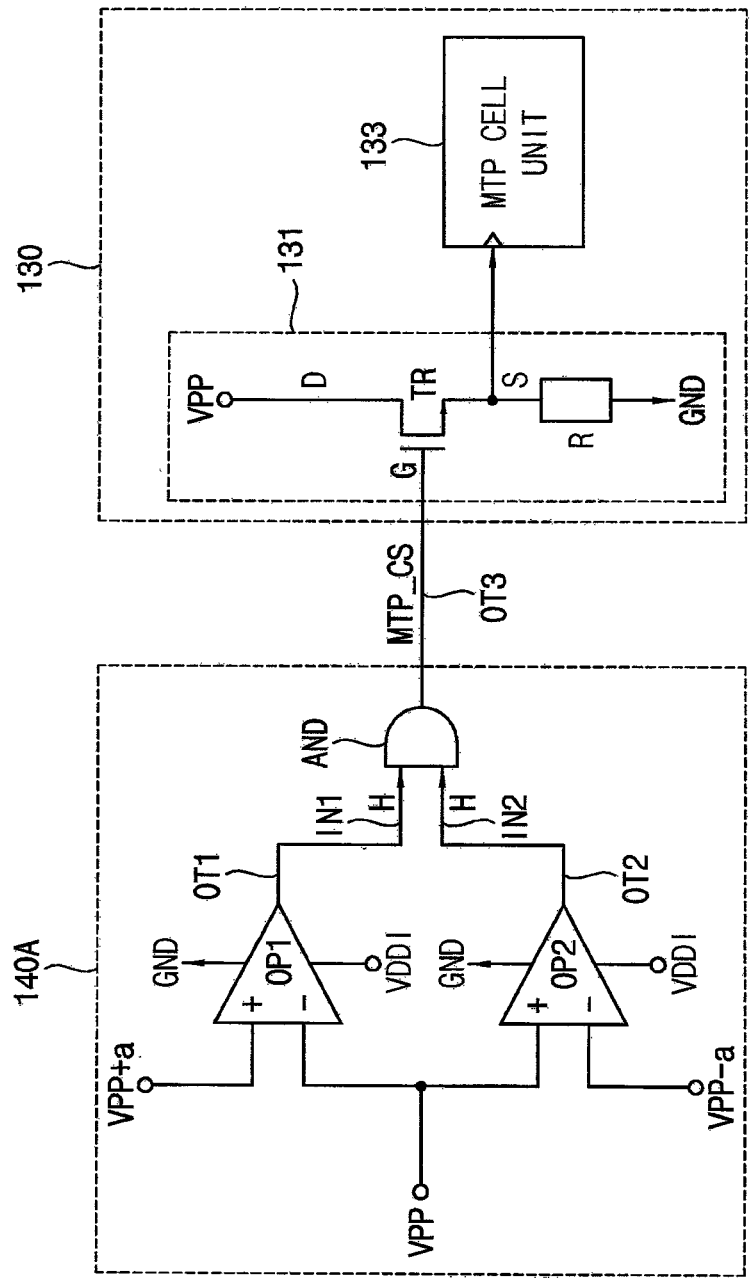
FIG. 6 is a circuit diagram illustrating an MTP protection part according to one exemplary embodiment.

FIG. 6 is a circuit diagram illustrating an MTP protection part according to one exemplary embodiment.

Referring to FIGS. 1 and 6, the MTP protection part 140A may include a first comparator OP1, a second comparator OP2 and a logic circuit AND.

The first comparator OP1 may include a first input terminal (+) receiving a first reference voltage VPP+a that is a high voltage higher than the MTP voltage VPP, a second input terminal (−) receiving the MTP voltage VPP and an output terminal OT1. The first comparator OP1 may receive a first power source voltage VDDI and a second power source voltage GND.

The first comparator OP1 is configured to output a high signal H when the MTP voltage VPP is lower than the first reference voltage VPP+a, and output a low signal L when the MTP voltage VPP is higher than the first reference voltage VPP+a.

The second comparator OP2 may include a first input terminal (+) receiving the MTP voltage VPP, a second input terminal (−) receiving a second reference voltage VPP-a that is a low voltage lower than the MTP voltage VPP and an output terminal OT2. The second comparator OP2 may receive the first power source voltage VDDI and the second power source voltage GND.

The second comparator OP2 is configured to output a high signal H when the MTP voltage VPP is higher than the second reference voltage VPP-a, and output a low signal L when the MTP voltage VPP is lower than the second reference voltage VPP-a.

The logic circuit AND may be an AND gate of a logical operator. The logic circuit AND may include a first input terminal IN1 connected to the output terminal OT1 of the first comparator OP1, a second input terminal IN2 connected to the output terminal OT2 of the second comparator OP2 and an output terminal OT3 connected to the nonvolatile memory 130.

The logic circuit AND is configured to output the write control signal MTP_CS of a high signal H when a high signal H is received from the first comparator OP1 and a high signal H is received from the second comparator OP2.

The logic circuit AND is configured to output the write control signal MTP_CS of a low signal L when a low signal L is received from at least one of the first comparator OP1 and the second comparator OP2.

The nonvolatile memory 130 may include a voltage controller 131 and an MTP unit 133.

The voltage controller 131 may include a control transistor TR.

The control transistor TR may include a control electrode connected to the output terminal OT3 of the logic circuit AND, a first electrode receiving the MTP voltage VPP and a second electrode connected to a voltage terminal of the MTP unit 133.

When an output signal of the logic circuit AND is the high signal H, the control transistor TR is turned on and the MTP voltage VPP is outputted through the voltage terminal of the MTP unit 133. Thus, when the MTP voltage VPP is applied to the MTP unit 133, a multi-time programming process is performed.

However, when an output signal of the logic circuit AND is the low signal L, the control transistor TR is turned off and the MTP voltage VPP is blocked from being applied to the MTP voltage terminal of the nonvolatile memory 130.

According an exemplary embodiment, when the MTP voltage VPP is between the first reference voltage VPP+a and the second reference voltage VPP-a, the MTP voltage VPP is applied to the MTP voltage terminal of the nonvolatile memory 130. When the MTP voltage VPP is equal to or less than the second reference voltage VPP-a or equal to or more than the first reference voltage VPP+a, the MTP voltage VPP may be blocked from being applied to the MTP voltage terminal of the MTP unit 133.

Therefore, the abnormal data may be prevented from being written in the nonvolatile memory 130.

Hereinafter, the same reference numerals are used to refer to the same or like parts as those described in the previous exemplary embodiments, and the same detailed explanations are not repeated unless necessary.

Figure 7:
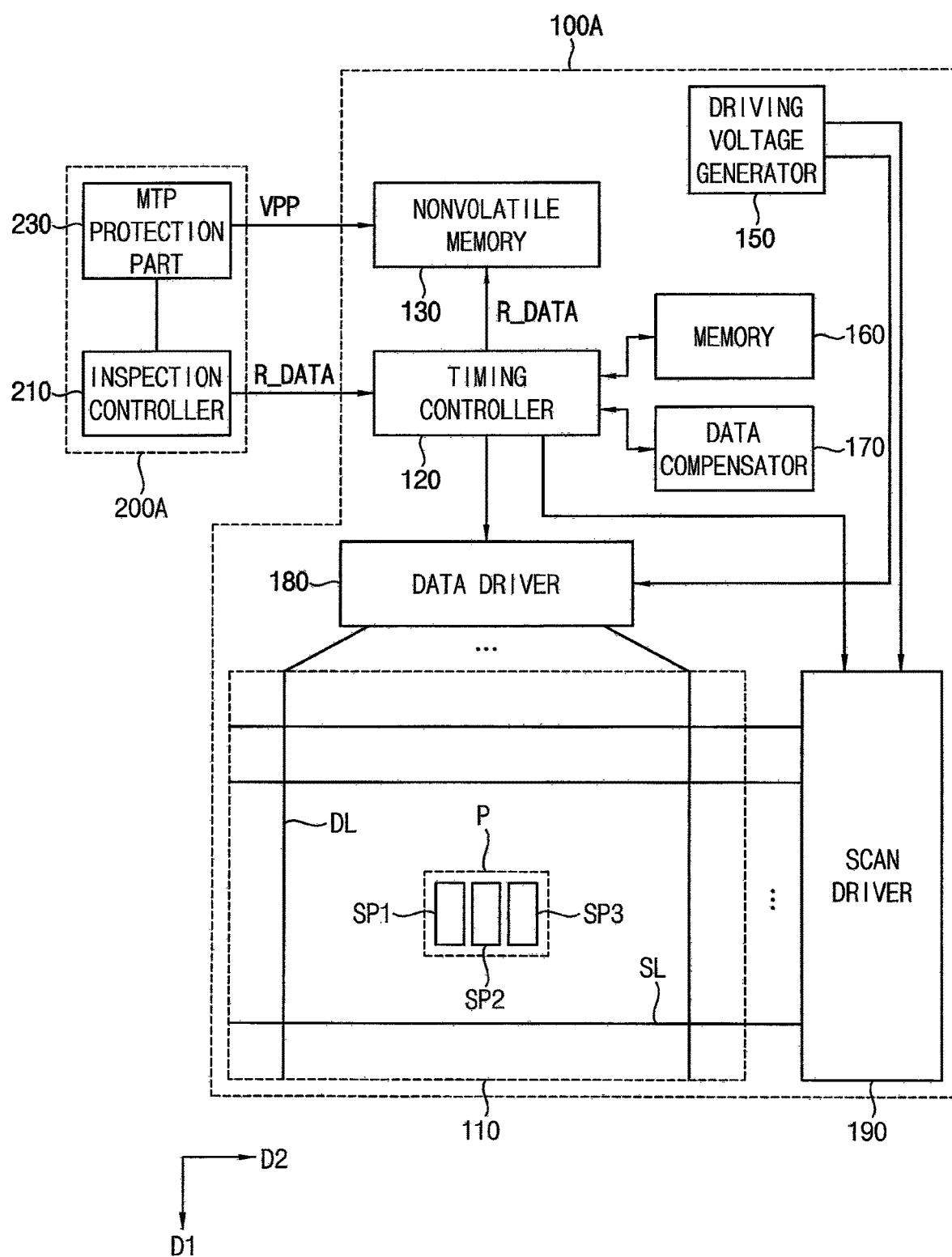
FIG. 7 is a block diagram illustrating an inspection system according to one exemplary embodiment.

FIG. 7 is a block diagram illustrating an inspection system according to one exemplary embodiment.

Referring to FIG. 7, the inspection system may include a display device 100A and an inspection device 200A.

The inspection device 200A may transfer a writing voltage that is an MTP voltage VPP applied to the nonvolatile memory 130 and various reference data R_DATA to the display device 100A in a multi-time programming mode which the reference data write to the nonvolatile memory 130 of the display device 100A.

The multi-time programming mode may be performed in a sleep-in mode in which the display device 100A does not display an image.

The display device 100A may include a display part 110, a timing controller 120, a nonvolatile memory 130, a driving voltage generator 150, a memory 160, a data compensator 170, a data driver 180 and a scan driver 190.

The display part 110 may include a plurality of data lines DL, a plurality of scan lines SL, and a plurality of sub pixels SP1, SP2 and SP3.

The timing controller 120 may generally control operations of the display device 100A.

According to an exemplary embodiment, the timing controller 120 is configured to receive reference data R_DATA from the inspection device 200A so that the receive reference data R_DATA is written to the nonvolatile memory 130 in the multi-time programming mode.

In the multi-time programming mode, the timing controller 120 is configured to write the reference data R_DATA to the nonvolatile memory 130 using the MTP voltage VPP provided from the inspection device 200A.

The MTP voltage VPP is a control voltage for controlling a status of a plurality of OTP cells in the nonvolatile memory 130. For example, the OTP cell initially maintains a '0' status and changes from the '0' status to a '1' status when the write voltage is applied. The OTP cell may write '0' or '1' of 1-bit data.

The driving voltage generator 150 is configured to generate a plurality of driving voltages.

The memory 160 may store the reference data provided from the nonvolatile memory 130 during a period during which the display device displays a normal image in a display mode.

The data compensator 170 is configured to generate compensation image data using the reference data for compensation of image data stored in the memory 160 according to the control of the timing controller 120 in the display mode.

The data driver 180 is configured to generate a data voltage corresponding to the image data according to the control of the timing controller 120 based on the reference data stored in the memory 160 and provide the data voltage to the plurality of data lines DL.

The scan driver 190 is configured to generate scan signals according to the control of the timing controller 120 based on the reference data stored in the memory 160, and sequentially provide the scan signals to the plurality of scan lines SL.

The inspection device 200A may include an inspection controller 210 and an MTP protection part 230.

In the multi-time programming mode, the inspection controller 210 is configured to transfer the reference data R_DATA for writing to the nonvolatile memory 130 to the timing controller 120.

The inspection controller 210 is configured to apply the MTP voltage VPP that is the writing voltage of the nonvolatile memory 130 to the MTP protection part 230.

The inspection controller 210 is configured to provide the MTP protection part 230 with a plurality of reference voltages for determining the allowable voltage range for checking whether the MTP voltage is abnormal.

The MTP protection part 230 is configured to check the MTP voltage VPP based on an allowable voltage range. The MTP protection part 230 may block the MTP voltage VPP from being applied to the nonvolatile memory 130 when the MTP voltage VPP is not within the allowable voltage range.

The MTP protection part 230 may include the same or like parts as those described in the previous exemplary embodiments referring to FIGS. 2 and 6.

According to the exemplary embodiment, the inspection device 200A may include the MTP protection part 230. After checking whether the MTP voltage VPP is abnormal, only the normal MTP voltage VPP is applied to the nonvolatile memory 130 of the display device 100A. Thus, an abnormal MTP voltage due to an error of the inspection device may be prevented from being applied to the nonvolatile memory 130.

Figure 8:
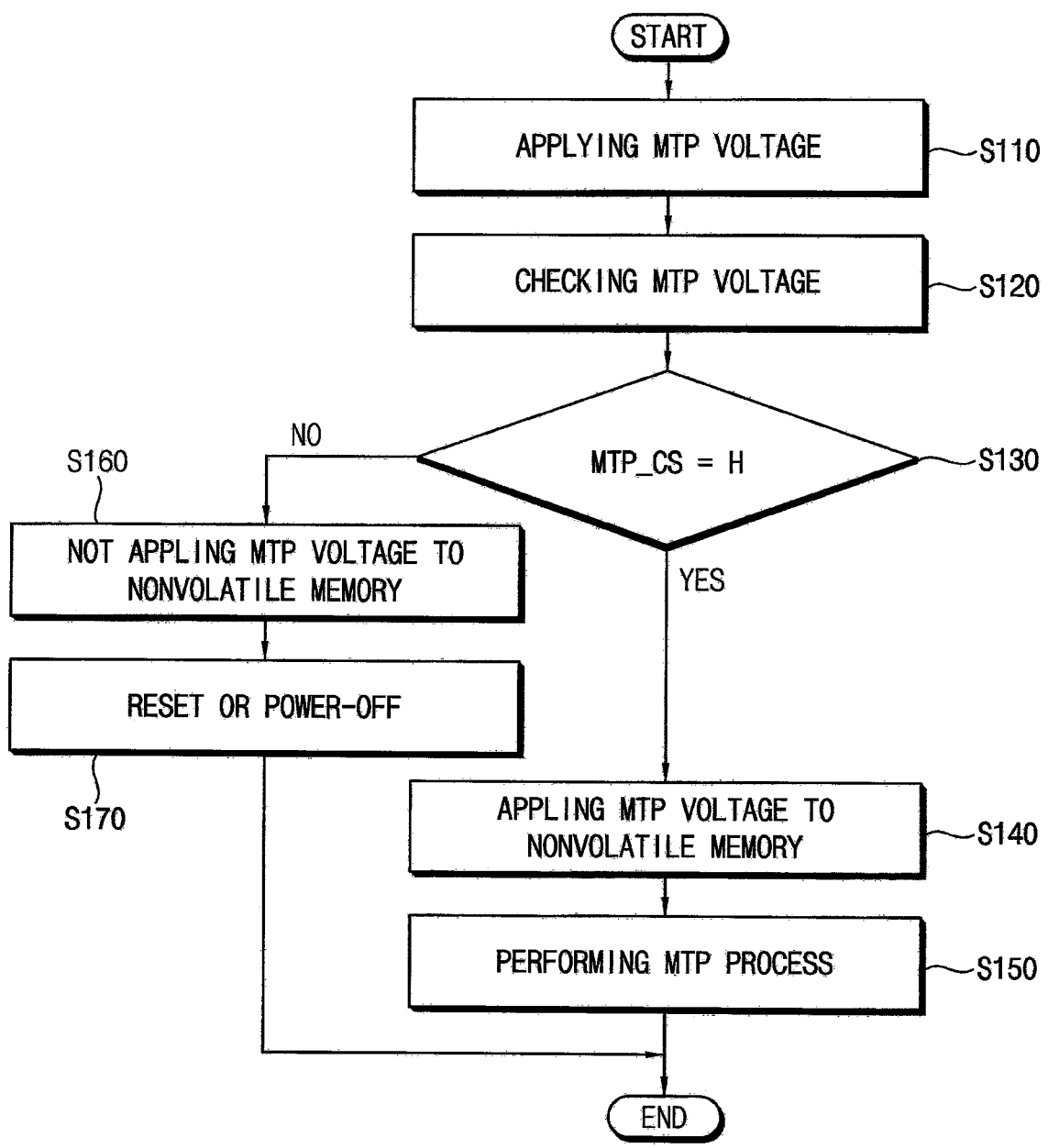
FIG. 8 is a flowchart illustrating a method of multi-time programming a display device according to one exemplary embodiment.

FIG. 8 is a flowchart illustrating a method of multi-time programming a display device according to one exemplary embodiment.

Referring to FIGS. 1 and 8, in the multi-time programming mode, the inspection device 200 is configured to transfer the MTP voltage VPP and the reference data R_DATA to the display device 100.

The MTP protection part 140 receives the MTP voltage VPP from the inspection device 200 (Step S110).

Referring to FIG. 2, the MTP protection part 140 includes a first comparator OP1, a second comparator OP2 and a logic circuit NOR.

The first comparator OP1 outputs the low signal L when the MTP voltage VPP is more than the first reference voltage VPP-a, and output the high signal H when the MTP voltage VPP is less than the first reference voltage VPP-a.

The second comparator OP2 outputs the low signal L when the MTP voltage VPP is less than the second reference voltage VPP+a, and outputs the high signal H when the MTP voltage VPP is more than the second reference voltage VPP+a.

The logic circuit NOR outputs the write control signal MTP_CS of the high signal H when the low signal L is received from each of the first comparator OP1 and the second comparator OP2 (Step S130).

The nonvolatile memory 130 includes a voltage controller 131 and an MTP unit 133. The voltage controller 131 includes a control transistor TR.

When the output signal of the logic circuit NOR is the high signal H, the control transistor TR is turned on and the MTP voltage VPP is applied to the voltage terminal of the MTP unit 133 (Step S140).

Thus, when the MTP voltage VPP is applied to the MTP unit 133, a multi-time programming process is performed (Step S150).

However, when the at least one of the first and second comparators OP1 and OP2 outputs the high signal H, the logic circuit NOR outputs the write control signal MTP_CS of the low signal L. When the MTP voltage VPP is lower than the first reference voltage VPP-a or higher than the second reference voltage VPP+a, the logic circuit NOR outputs the write control signal MTP_CS of the low signal L (Step S130).

When the output signal of the logic circuit NOR is the low signal L, the control transistor TR is turned off and the MTP voltage VPP is not applied to the MTP voltage terminal of the nonvolatile memory 130 (Step S160).

According to the exemplary embodiment, when the write control signal MTP_CS is the low signal L, the inspection device 200 may initialize the multi-time programming mode (Step S170).

According to the exemplary embodiment, when the write control signal MTP_CS is the low signal L, the timing controller 120 may turn the display device into a turned-off state (Step S170).

According to the exemplary embodiment, in the multi-time programming mode, the MTP protection part 140 checks whether the MTP voltage is the abnormal MTP voltage. When the MTP voltage is the abnormal MTP voltage, the abnormal MTP voltage may be blocked from being applied to the nonvolatile memory. Thus, the abnormal data may be prevented from being written into the nonvolatile memory.

Accordingly, the driving reliability of the display device may be improved by writing normal reference data in the nonvolatile memory.

The present disclosure may be applied to a display device and an electronic device having the display device. For example, the present disclosure may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of aspects of embodiments of the present disclosure and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An inspection system comprising:
a display device comprising a nonvolatile memory;
an inspection device configured to generate a writing voltage and reference data obtained in characteristics tests of the display device for application to the nonvolatile memory; and
a protection part configured to apply the writing voltage to the nonvolatile memory when the writing voltage is within an allowable voltage range, and configured not to apply the writing voltage to the nonvolatile memory when the writing voltage is not within the allowable voltage range, the application of the writing voltage to the nonvolatile memory enabling a multi-time programming (MTP) operation in which the reference data obtained in characteristics tests of the display device writes to the nonvolatile memory in a multi-time programming mode which is performed in a sleep-in mode in which the display device does not display an image.

2. The inspection system of claim 1, wherein the inspection device comprises an inspection controller configured to generate the writing voltage, and
wherein the protection part is connected between the inspection controller and the nonvolatile memory.

3. The inspection system of claim 2, wherein the protection part is in the display device.

4. The inspection system of claim 2, wherein the protection part is in the inspection device.

5. The inspection system of claim 2, wherein the protection part comprises:
a first comparator configured to compare a first reference voltage and the writing voltage;
a second comparator configured to compare a second reference voltage and the writing voltage; and
a logic circuit configured to generate a write control signal for controlling whether to apply the writing voltage to the nonvolatile memory based on output signals of the first and second comparators.

6. The inspection system of claim 5, wherein the first reference voltage is a low voltage lower than the writing voltage, the second reference voltage is a high voltage higher than the writing voltage, and the logic circuit is an NOR logical operator.

7. The inspection system of claim 5, wherein the first reference voltage is a high voltage higher than the writing voltage, the second reference voltage is a low voltage lower than the writing voltage, and the logic circuit is an AND logical operator.

8. The inspection system of claim 2, wherein the nonvolatile memory comprises:
an MTP cell unit comprising a plurality of one-time programming (OTP) cells; and
a voltage controller configured to control whether to apply the writing voltage to the MTP cell unit in response to the write control signal.

9. The inspection system of claim 8, wherein the OTP cell is configured to initially maintain a '0' status and configured to change from the '0' status to a '1' status when the write voltage is applied.

10. The inspection system of claim 8, wherein the voltage controller comprises a transistor comprising a control electrode configured to receive the write control signal, a first electrode configured to receive the writing voltage and a second electrode connected to the MTP cell unit.

11. A method of multi-time programming (MTP) reference data obtained during characteristics tests of a display device to a nonvolatile memory in the display device, the method comprising:
- generating a writing voltage for writing to the nonvolatile memory;
- applying the writing voltage to the nonvolatile memory when the writing voltage is within an allowable voltage range;
- not applying the writing voltage to the nonvolatile memory when the writing voltage is not within the allowable voltage range; and
- writing the reference data obtained during the characteristics tests of the display device to the nonvolatile memory using the writing voltage in a multi-time programming mode which is performed in a sleep-in mode in which the display device does not display an image.

12. The method of claim 11, further comprising:
- comparing a first reference voltage and the writing voltage;
- comparing a second reference voltage and the writing voltage; and
- generating a write control signal for controlling whether to apply the writing voltage to the nonvolatile memory based on the comparing the first reference voltage and the writing voltage and the comparing the second reference voltage and the writing voltage.

13. The method of claim 12, wherein the first reference voltage is a low voltage lower than the writing voltage, the second reference voltage is a high voltage higher than the writing voltage, and the write control signal is generated by using an NOR logical operator.

14. The method of claim 12, wherein the first reference voltage is a high voltage higher than the writing voltage, the second reference voltage is a low voltage lower than the writing voltage, and the write control signal is generated by using an AND logical operator.

15. The method of claim 11, further comprising:
- controlling whether to apply the writing voltage to an MTP cell unit in response to the write control signal,
- wherein the nonvolatile memory includes the MTP cell unit, and wherein the MTP cell unit comprises a plurality of one-time programming (OTP) cells.

16. The method of claim 15, wherein the OTP cell initially maintains a '0' status and changes from the '0' status to a '1' status when the write voltage is applied.

17. A display device comprising:
- a display part comprising a plurality of pixels;
- a nonvolatile memory; and
- a protection part configured to receive a writing voltage for application to the nonvolatile memory, the protection part configured to apply the writing voltage to the nonvolatile memory when the writing voltage is within an allowable voltage range, and configured not to apply the writing voltage to the nonvolatile memory when the writing voltage is not within the allowable voltage range, the application of the writing voltage to the nonvolatile memory enabling a multi-time programming (MTP) operation in which reference data obtained in characteristics tests of the display device writes to the nonvolatile memory in a multi-time programming mode which is performed in a sleep-in mode in which the display device does not display an image.

18. The display device of claim 17, wherein the protection part comprises:
- a first comparator configured to compare a first reference voltage and the writing voltage;
- a second comparator configured to compare a second reference voltage and the writing voltage; and
- a logic circuit configured to generate a write control signal for controlling whether to apply the writing voltage to the nonvolatile memory based on output signals of the first and second comparators.

19. The display device of claim 18, wherein the nonvolatile memory comprises:
- an MTP cell unit comprising a plurality of one-time programming (OTP) cells; and
- a voltage controller configured to control whether to apply the writing voltage to the MTP cell unit in response to the write control signal.

20. The display device of claim 18, further comprising:
- a driving voltage generator configured to generate the first reference voltage and the second reference voltage.

* * * * *